United States Patent [19]

Kondoh

[11] Patent Number: 5,250,924
[45] Date of Patent: * Oct. 5, 1993

[54] POWER SUPPLY TESTING SYSTEM FOR NON-UTILITY POWER GENERATORS AND SO ON

[75] Inventor: Toyoshi Kondoh, Tokyo, Japan
[73] Assignee: Tatsumi Corporation, Tokyo, Japan
[*] Notice: The portion of the term of this patent subsequent to Apr. 21, 2009 has been disclaimed.
[21] Appl. No.: 788,295
[22] Filed: Nov. 5, 1991
[51] Int. Cl.[5] .......................................... H01C 1/082
[52] U.S. Cl. ...................................... 338/56; 338/80; 338/83; 338/86; 324/158 R
[58] Field of Search ..................... 338/56, 80, 83, 86, 338/84; 73/290 R, 304 R; 324/158 R, 158 MG, 425, 691, 450

[56] References Cited

U.S. PATENT DOCUMENTS 1,233,959  7/1917  Bennet .............................. 338/84 X
4,510,483  4/1985  Bensadoun ............................ 338/80
4,670,735  6/1987  Bensadoun ........................ 338/86 X
4,853,621  8/1989  Matsumoto ....................... 338/56 X
5,107,209  4/1992  Kondo ............................ 324/158 R

*Primary Examiner*—Marvin M. Lateef
*Attorney, Agent, or Firm*—Wenderoth, Lind & Ponack

[57] ABSTRACT

A power supply testing system for non-utility power generators, etc. includes a test tank filled with a resistive liquid; a main electrode housed within the test tank to receive power from a non-utility power generator to be tested; a movable insulator member interposed between the main electrode and the test tank to regulate the amount of power supplied from the main electrode to the tank; and a piping system for cooling or filtering the resistive liquid within the test tank and returning it to the test tank, thereby recycling the resistive liquid. The main electrode is supported at an upper portion of the test tank and depends therefrom, and the piping system includes an inlet pipe located above the test tank for feeding the resistive liquid into the test tank, while power is supplied through said inlet pipe.

3 Claims, 4 Drawing Sheets

POWER SUPPLY TESTING SYSTEM FOR NON-UTILITY POWER GENERATORS AND SO ON

BACKGROUND OF THE INVENTION

1. Field of the Invention

The present invention relates to a power supply testing system for non-utility power generators, etc. This type of testing system, for instance, has applications in testing the power outputs of non-utility power generators provided in highrise buildings, etc. in order to cope with such emergent situations as power breakdowns.

2. Prior Art

Referring now to FIG. 4, there is a conventional power supply testing system. As illustrated, this system includes a test tank 12 with a main electrode 14 built in it, said main electrode 14 being fixedly supported at its bottom on a terminal 50, which also serves as a bracket, with a bolt 52 of large diameter fixed to the terminal 50 and an associated nut 54. Between the main electrode 14 and the tank 12 and the tank 12 and the terminal 50, there are interposed insulators 56, and on both end sides of a bolt hole 58 formed through the bottom of the tank 12 there are provided packings 60 for preventing water leakage. The tank 12 is filled with a resistive liquid 10, and the terminal 50 for supplying power to the main electrode 14 and the tank 12 are connected with a non-utility power generator (not shown) by way of an output cable 62.

In order to test the output characteristics of the power generator, power is supplied between the tank 12 and the main electrode 14 for the required period of time.

However, a major problem with the above-mentioned conventional testing system is that the liquid may leak from the bolt hole 58 through the bottom of the tank 12, because the main electrode 14 is supported at its lower portion with the bolt 52.

Particularly because the bolt 52 generates heat when heated to a high temperature by power supply during testing, the packings 60 and insulators 56 are likely to suffer damage and deteriorate prematurely. Such damage occurs due to changes during the year as well.

In some cases, the bolt 52 may possibly break down due to heat generation. Increasing the diameter of the bolt 52 so as to increase its durability, however, would incur some considerable expense.

SUMMARY OF THE INVENTION

Having been undertaken with such problems in mind, the present invention seeks to provide a power supply testing system for non-utility power generators, etc. which enables power supply testing to be well performed with no fear of liquid leakage.

According to this invention, the above-mentioned object is achieved by the provision of a power supply testing system for non-utility power generators, etc., which includes a test tank which is filled with a resistive liquid; a main electrode housed within said test tank to receive power from a non-utility power generator to be tested; a movable insulator member interposed between said main electrode and said test tank to regulate the amount of power supplied from said main electrode to said tank; and piping means for cooling or filtering said resistive liquid within said test tank and returning it to said test tank, thereby recycling said resistive liquid, wherein:

said main electrode is supported at an upper portion of said test tank and depending therefrom, and
a part of said piping means is formed by an inlet pipe located above said test tank for feeding said resistive liquid into said test tank, while power is supplied through said inlet pipe.

In one preferred embodiment of this invention, a flow rate regulating member is further provided to regulate the flow rate of the resistive liquid supplied to the test tank.

In another preferred embodiment of this invention, the inlet pipe is further covered with an insulating material.

According to this invention wherein the main electrode is supported at an upper portion of the test tank and depends therefrom, it is unnecessary to provide through the test tank any hole for supporting the main electrode.

Since the inlet pipe through which power is supplied to the main electrode is designed to be cooled by the resistive liquid flowing through it, there is no fear of dielectric breakdown due to discharge.

BRIEF DESCRIPTION OF THE DRAWINGS

The present invention will now be explained more illustratively but not exclusively with reference to the accompanying drawings, in which.

DETAILED DESCRIPTION OF THE PREFERRED EMBODIMENTS

Figure 1:
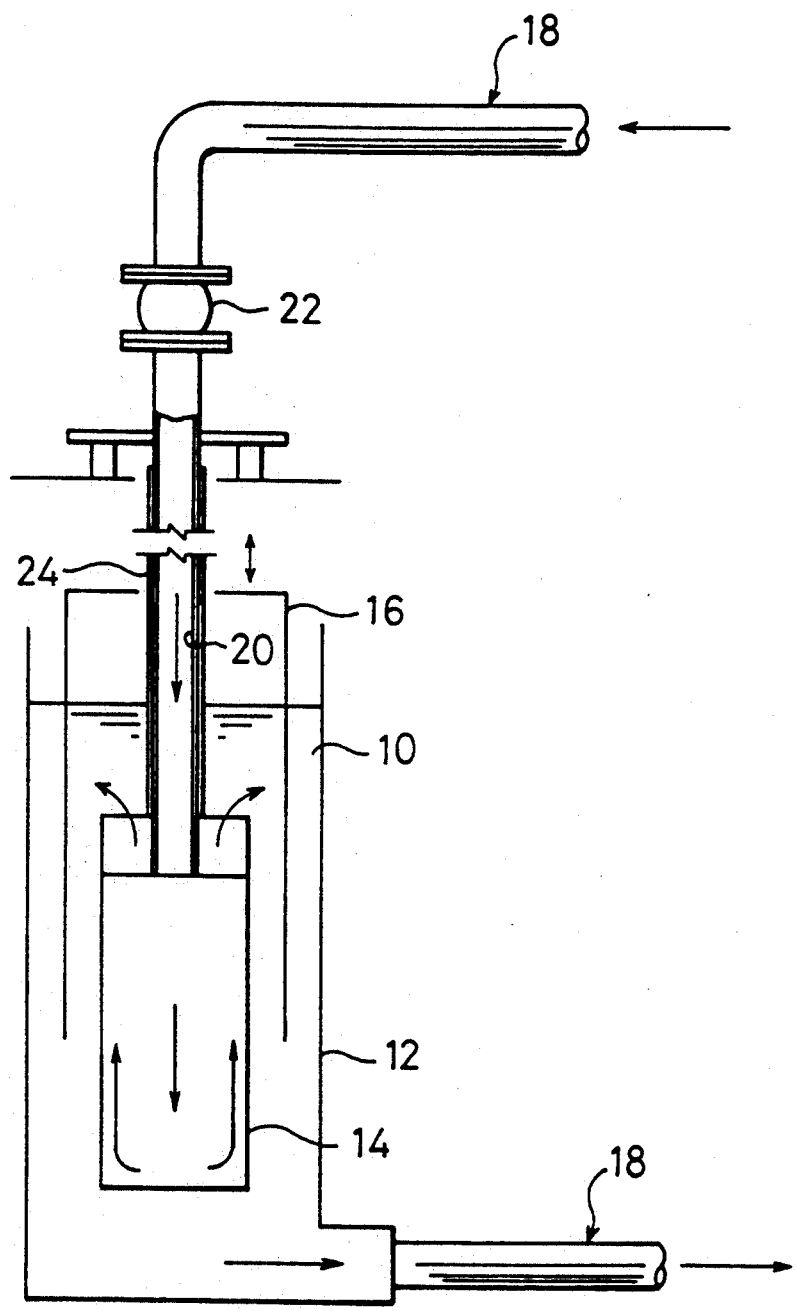
FIG. 1 is a schematic view of the system according to this invention.
Figure 2:
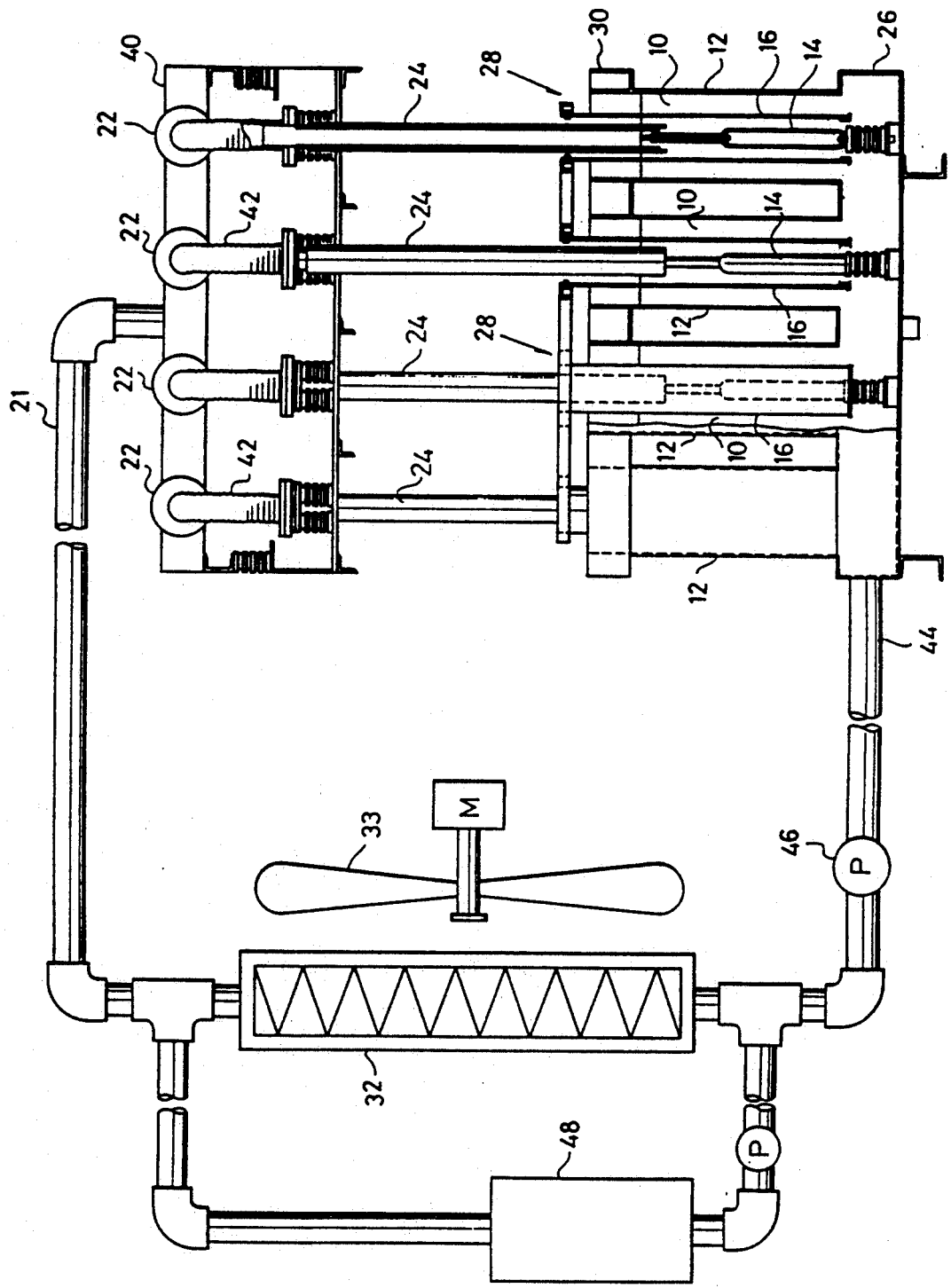
FIG. 2 is a front view of one embodiment of the system according to this invention.

Referring first to FIG. 2, there is shown a general arrangement of one preferred embodiment of the power supply testing system according to this invention. Above a common tank 26 there are four test tank units 28, to which power is applied.

Of these test tank units, one is a spare, because a power generator to be tested is generally of a three-phase AC type.

Each of the tank units 28 is built up of a substantially cylindrical tank body 12 located above the common tank 26, a depending main electrode 14 housed within the tank body 12 and a movable insulator 16 interposed between the tank body 12 and the main electrode 14. The tank body 12 is filled with a resistive liquid, for which water is usually used.

It is noted that the tank body 12 is provided at its upper end with an overflow receiving member 30 to accommodate for the expansion of the resistive liquid 12 heated at an initial stage of power supply, thereby ensuring that any water leakage is prevented, and contributing to greater safety.

The tank body 12 and the associated main electrode 14 are both cylindrical for enabling a current to be well supplied between them.

The common tank 26, on the one hand, serves to collect the resistive liquids 10 stored in the test tank bodies 12 . . . located above it and feed them to a radiator 32 to be described later.

On the other hand, the common tank 26 plays a role in receiving an amount of air produced in the tank bodies 12 . . . in operation and guiding it to the spare tank body 12, not in operation, for venting purposes. This is because when much air is entrained in the tank body 12, an arc occurs during testing, putting the load in a state so ill-balanced that no accurate testing is achievable.

It is to be understood that an inlet pipe 20 covered with an insulating material 24 such as Teflon extends from above into the tank body 12, supporting the main electrode 14.

Figure 3:
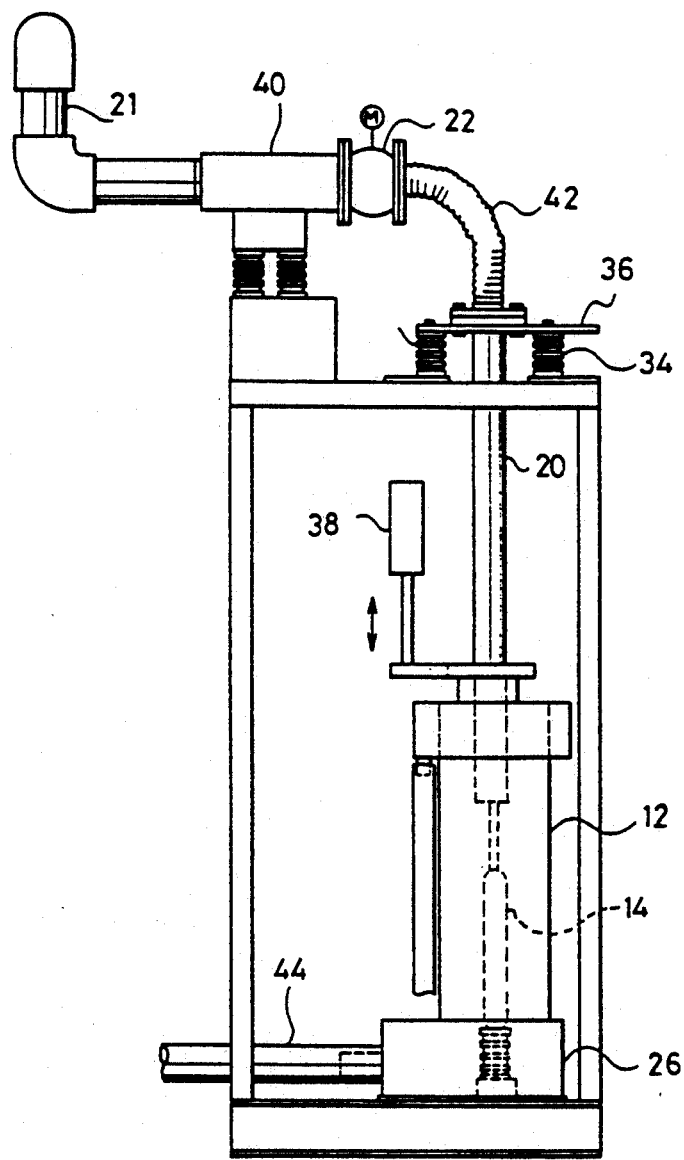
FIG. 3 is a side view of the system shown in FIG. 2.
Figure 4:
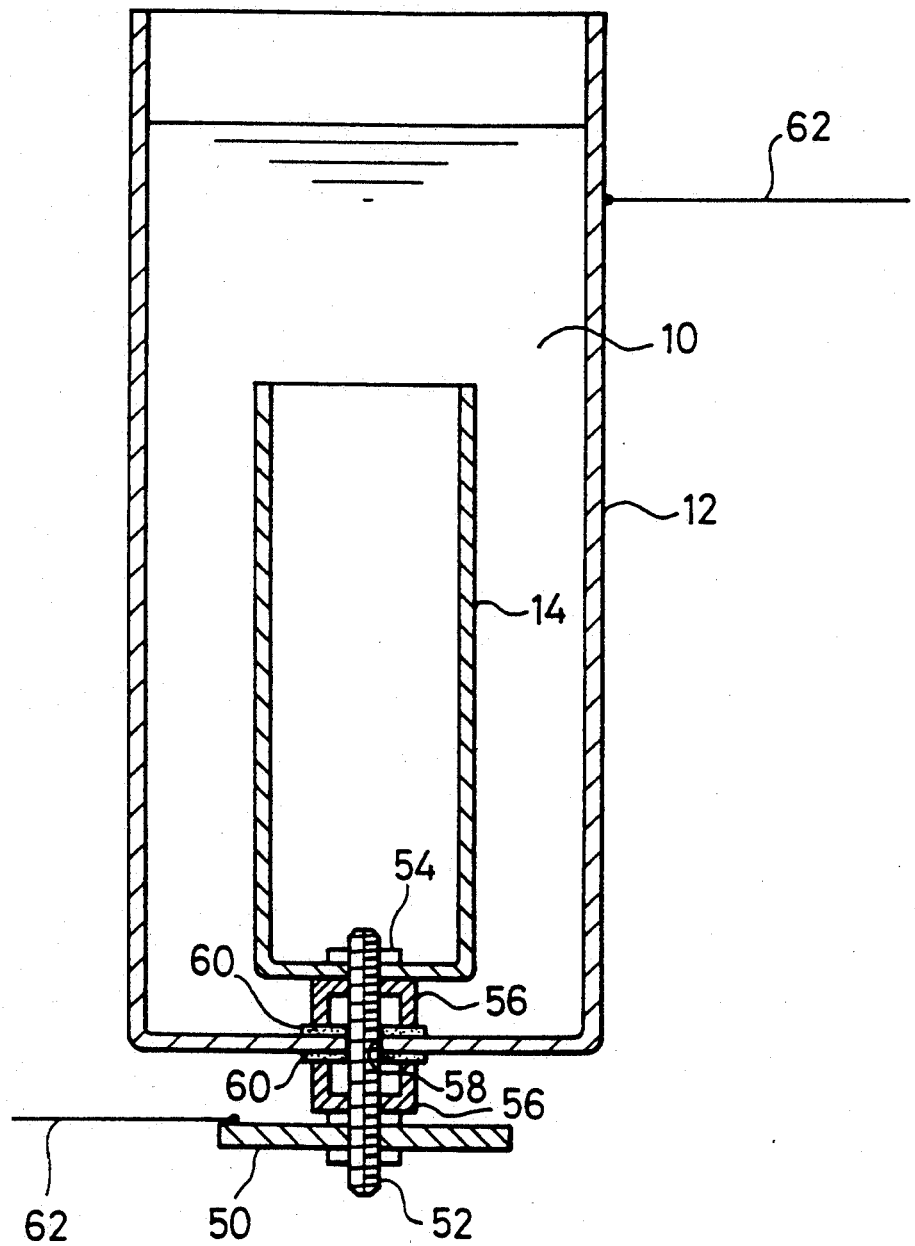
FIG. 4 is a sectional view showing a conventional testing system.

As illustrated in FIG. 3, the inlet pipe 20 is provided at its upper end with a connecting terminal bar 36 through an insulator 34. The bar 36 is in turn connected with a cable of the non-utility power generator to be tested to supply a current between the main electrode 14 and the tank body 12.

As again illustrated, the substantially cylindrical movable insulator 16 interposed between the tank body 12 and the associated main electrode 14 is supported by an elevator 38.

As the movable insulator 16 is vertically displaced by the elevator 38, the areas of the main electrode 14 and tank body 12 capable of receiving power are varied to regulate the amount of the current supplied.

Above the tank bodies 12 there is a common tank unit 40, which is connected with the inlet pipes 20 by way of flexible hoses 42 resistant to both voltage and corrosion.

The tank unit 40 is provided with a main supply pipe 21 for supplying the resistive liquid 10, and between it and each flexible hose 42 there is mounted a regulator valve 22 for regulating the flow rate of the resistive liquid 10 flowing toward the inlet pipe 20.

The common unit 26 located below the test tank bodies 12 is provided with a drain pipe 44 for draining off the resistive liquid 10, said drain pipe 44 being equipped with a pump 46 intermediate its length.

The drain pipe 44 is connected to the radiator 32 having its outlet side connected with the main supply pipe 21.

The resistive liquids 10 heated in the tank bodies 12 are pumped through the drain pipe 44 to the radiator 32 in which they are combined together and heat-exchanged or cooled down and then fed therefrom to the expansion tank unit 40 through the main supply pipe 21. Afterwards, the liquid is again distributed from the tank unit 40 to the respective tank bodies 12 through the associated flexible hoses 42 and inlet branches 20.

In this case, the regulating valve 22 of the spare tank unit 28 remains so closed that the resistive liquids 12 can circulate through the three other tank units 28.

Although the resistive liquid 10 does not circulate through the spare tank 12, it is distributed from the spare tank 10 to the resistive liquids 10 contained in the remaining tanks 10, so that the temperatures of the resistive liquids 10 in the three other tanks 12 in operation can be substantially leveled out in cooperation with the flow rate regulation achieved by the aforesaid regulating valves 22. Thus, the loads on the tanks remain so well-balanced that more accurate tests than ever before can be performed.

In order to prevent the temperature of the resistive liquid 10 form exceeding a predetermined value during operation, the radiator 32 is cooled by a fan 33.

It is understood that the resistive liquid 10, if required, may be filtered through filter equipment 48 (especially when the testing system is used for high-voltage tests).

According to the embodiment of this invention wherein, as explained and illustrated, the main electrode is supported at its upper portion by the inlet pipe and depending from an upper portion of the test tank, it is unnecessary to provide through the bottom of the test tank any hole for supporting the main electrode. Thus, there is no fear of water leakage at all.

Besides, the present testing system has a number of merits which include the following.

Since any custom-designed part is not needed for mounting the main electrode, there is no fear of incurring any extra expense.

Since the inlet pipe through which power is supplied to the main electrode is designed to be cooled by the resistive liquid flowing through it and covered with the insulating material, there is no fear of dielectric breakdown due to discharge. Thus, power tests can be well performed with greater safety.

Since the flow rate of the resistive liquid supplied to the test tank 12 is regulated by the flow rate regulating valve, it is possible to closely control the water temperature.

What is claimed is:

1. A power supply testing system for use with non-utility power generators said system comprising: a test tank filled with a resistive liquid; a main electrode housed within said test tank to receive power from a power generator to be tested; a movable electrically insulative member interposed between said main electrode and said test tank to regulate the amount of power supplied from said main electrode to said tank; and piping means for cooling or filtering said resistive liquid within said test tank and returning it to said test tank, thereby recycling said resistive liquid, said main electrode being supported at an upper portion of said test tank and depending therefrom, part of said piping means being an inlet pipe located above said test tank for feeding said resistive liquid into said test tank, and power being supplied to said main electrode through said inlet pipe.

2. A system as claimed in claim 1, and further including a flow rate regulating member provided to regulate the flow rate of said resistive liquid supplied to said test tank.

3. A system as claimed in claim 2, wherein said inlet pipe is covered with an insulating material.

* * * * *